(12) United States Patent
Jeong et al.

(10) Patent No.: US 10,817,277 B2
(45) Date of Patent: Oct. 27, 2020

(54) APPARATUS AND METHOD FOR PROVIDING UPDATE OF VEHICLE

(71) Applicants: Hyundai Motor Company, Seoul (KR); Kia Motors Corporation, Seoul (KR)

(72) Inventors: Heok Sang Jeong, Jeollanam-do (KR); Jae Am Seo, Gyeonggi-do (KR); Myeong Gyu Jeong, Seoul (KR); Hee Jun Lee, Seoul (KR); Dong Youl Lee, Seoul (KR); Dong Jin Shin, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/207,141

(22) Filed: Dec. 2, 2018

(65) Prior Publication Data

US 2020/0073653 A1 Mar. 5, 2020

(30) Foreign Application Priority Data

Sep. 5, 2018 (KR) .......................... 10-2018-0106013

(51) Int. Cl.
*G06F 8/65* (2018.01)
*H04W 4/40* (2018.01)
(Continued)

(52) U.S. Cl.
CPC .............. *G06F 8/65* (2013.01); *B60R 16/033* (2013.01); *G01R 31/36* (2013.01); *G06F 1/329* (2013.01); *H04W 4/40* (2018.02)

(58) Field of Classification Search
None
See application file for complete search history.

(56) References Cited

U.S. PATENT DOCUMENTS 9,575,743 B1 * 2/2017 Chun .................... B60L 58/12
2008/0134347 A1 * 6/2008 Goyal ................ G06F 21/6209
726/29

(Continued)

FOREIGN PATENT DOCUMENTS

EP          1 699 031 A1    9/2006
KR    10-2018-0068526 A    6/2018
(Continued)

OTHER PUBLICATIONS

• "Implementation of Online Battery State-of-Power and State-of-Function Estimation in Electric Vehicle Applications", Juang et. al., IEEE, 2012 (Year: 2012).*

(Continued)

*Primary Examiner* — Daxin Wu
(74) *Attorney, Agent, or Firm* — Mintz Levin Cohn Ferris Glovsky and Popeo, P.C.; Peter F. Corless

(57) ABSTRACT

An update providing apparatus of a vehicle is provided. The apparatus includes a communication circuit that communicates wirelessly with a server, a battery, and a control circuit. The control circuit is electrically connected to the communication circuit and the battery and obtains update data associated with a target controller mounted within the vehicle, from the server. Accordingly, the control circuit calculates an estimated remaining amount upon completing an update, based on an estimated required time of the update, an estimated required time of a roll-back, and a current remaining amount of the battery and performs the update on the target controller, when the estimated remaining amount satisfies a particular condition.

14 Claims, 6 Drawing Sheets

(51) Int. Cl.
    *B60R 16/033*     (2006.01)
    *G01R 31/36*     (2020.01)
    *G06F 1/329*     (2019.01)

(56) References Cited

U.S. PATENT DOCUMENTS

| | | | |
|---|---|---|---|
| 2008/0201702 A1* | 8/2008 | Bunn | G06F 8/656 |
| | | | 717/171 |
| 2012/0049802 A1* | 3/2012 | Barsukov | G01R 31/367 |
| | | | 320/136 |
| 2013/0326499 A1* | 12/2013 | Mowatt | G06F 8/60 |
| | | | 717/177 |
| 2014/0109075 A1* | 4/2014 | Hoffman | G06F 8/65 |
| | | | 717/169 |
| 2015/0113521 A1* | 4/2015 | Suzuki | G06F 8/65 |
| | | | 717/173 |
| 2016/0077827 A1* | 3/2016 | Throop | B60L 58/13 |
| | | | 717/168 |
| 2017/0242679 A1* | 8/2017 | Sangameswaran | G06F 8/65 |
| 2018/0191866 A1 | 7/2018 | Nakahara et al. | |
| 2018/0203683 A1 | 7/2018 | Kim | |
| 2018/0272964 A1 | 9/2018 | Netter | |
| 2019/0108010 A1* | 4/2019 | Tillman | G07C 5/0841 |
| 2020/0215930 A1* | 7/2020 | Izumi | B60L 53/305 |

FOREIGN PATENT DOCUMENTS

| | | |
|---|---|---|
| WO | 2014/002246 A1 | 1/2014 |
| WO | 2017/071811 A1 | 5/2017 |

OTHER PUBLICATIONS

"Extended European Search Report issued in European Application No. 18209495.3", dated Jun 7, 2019, 13 pages.

* cited by examiner

| Event | VEHICLE STATE | DISPLAY STATE |
|---|---|---|
| PREDICT THAT IT IS POSSIBLE TO MAINTAIN STARTING PERFORMANCE, UPON COMPLETING UPDATE | UPDATE READY STATE (COMPLETE ROM DOWNLOAD) | DO YOU WANT TO PERFORM UPDATE? |
| | UPDATING | 75% |
| PREDICT THAT STARTING PERFORMANCE IS INSUFFICIENT, UPON COMPLETING UPDATE | UPDATING | 75% PLEASE REDUCE LOAD USAGE |
| DETERMINE THAT STARTING PERFORMANCE IS INSUFFICIENT | INTERRUPT UPDATE AND PERFORM ROLLBACK | UPDATE IS INTERRUPTED BECAUSE BATTERY LEVEL IS LOW |

FIG.3

APPARATUS AND METHOD FOR PROVIDING UPDATE OF VEHICLE

CROSS-REFERENCE TO RELATED APPLICATION

This application claims the benefit of priority to Korean Patent Application No. 10-2018-0106013, filed on Sep. 5, 2018, the entire contents of which are incorporated herein by reference.

TECHNICAL FIELD

The present disclosure relates to a technology for updating a controller installed within a vehicle, and more particularly, to an apparatus and method that update a vehicle controller based on a remaining amount of a battery charge.

BACKGROUND

With the development of the automobile industry, a system for providing various services using wireless communication technology is continuously being developed to provide convenience to a driver. For example, a vehicle may update the software of a controller mounted within a vehicle, over wireless communication. Since the controller is not updated while the vehicle is being driven, the controller may be updated while the vehicle is parked. Further, power is required to update the controller, and the power may be supplied by the battery mounted within the vehicle. Accordingly, for the purpose of updating the controller, there is a need to secure the sufficient remaining amount of a battery.

For example, a controller may be updated in an ignition on state. A vehicle may receive power for updating the controller from a battery. The capacity of the battery of the vehicle is limited, and the battery of the vehicle always needs to have the power of a specific level or greater to ensure starting performance. Accordingly, the update may not be completed and may fail, when the wireless update of the controller is performed using the power of the battery; even though the update is completed, it may be impossible to secure starting performance.

SUMMARY

The present disclosure provides an apparatus and a method for securing the starting performance of a vehicle when updating a controller. The technical problems to be solved by the present inventive concept are not limited to the aforementioned problems, and any other technical problems not mentioned herein will be clearly understood from the following description by those skilled in the art to which the present disclosure pertains.

According to an aspect of the present disclosure, an update providing apparatus of a vehicle may include a communication circuit configured to communicate with a server wirelessly, a battery, and a control circuit electrically connected to the communication circuit and the battery. The control circuit may be configured to obtain update data associated with a target controller mounted within the vehicle, from the server, to calculate an estimated remaining amount of the battery (e.g., remaining battery charge) upon completing an update, based on an estimated required time of the update, an estimated required time of a roll-back, and a current remaining amount of the battery, and to perform the update on the target controller, when the estimated remaining amount satisfies a particular condition.

According to an exemplary embodiment, the control circuit may be configured to calculate a remaining time including the estimated required time of the update and the estimated required time of the roll-back, based on a size of the update data and to calculate the estimated remaining amount based on the remaining time and the current remaining amount. The control circuit may be configured to calculate an estimated state of charge (SOC) upon completing the update based on the remaining time and a current SOC of the battery, to calculate an estimated state of function (SOF) upon completing the update based on the estimated SOC and temperature information, and to perform the update on the target controller, when the estimated SOF satisfies a specified condition.

Further, the control circuit may be configured to calculate the estimated remaining amount, when the update is approved by a driver of the vehicle. The apparatus may further include an output device. The control circuit may be configured to output a message providing a notification that it is impossible to perform the update using the output device, when the estimated remaining amount does not satisfy the particular condition. The control circuit may be configured to monitor the estimated remaining amount, while performing the update.

Additionally, the apparatus may further include an output device. The control circuit may be configured to output a warning message using the output device, while performing the update, when the estimated remaining amount is less than a particular value. The control circuit may be configured to interrupt the update and perform the roll-back, while performing the update, when the current remaining amount of the battery is less than a particular value. The estimated SOC may be calculated based on the current SOC, a battery discharge current, the remaining time, and a battery capacity.

According to an exemplary embodiment, the estimated SOF may be calculated based on the current SOC and a minimum battery temperature during a specified time period. The control circuit may be configured to perform the update, when the estimated remaining amount is greater than a particular value. The particular value may be a battery voltage required to start an engine of the vehicle.

According to another aspect of the present disclosure, an update providing method of a vehicle may include obtaining update data associated with a target controller mounted within the vehicle, from a server, calculating an estimated remaining amount of a battery upon completing an update, based on an estimated required time of the update, an estimated required time of a roll-back, and a current remaining amount of the battery, and performing the update on the target controller, when the estimated remaining amount satisfies a specified condition.

According to an exemplary embodiment, the calculating of the estimated remaining amount may include calculating a remaining time including the estimated required time of the update and the estimated required time of the roll-back, based on a size of the update data and calculating the estimated remaining amount based on the remaining time and the current remaining amount. The calculating of the estimated remaining amount based on the remaining time and the current remaining amount may include calculating an estimated SOC upon completing the update based on the remaining time and a current SOC of the battery, calculating an estimated SOF upon completing the update based on the estimated SOC and temperature information, and the performing of the update may include performing the update on the target controller, when the estimated SOF satisfies a specified condition.

BRIEF DESCRIPTION OF THE DRAWINGS

The above and other objects, features and advantages of the present disclosure will be more apparent from the following detailed description taken in conjunction with the accompanying drawings:

FIG. 3 is a view for describing an exemplary operation of an update providing apparatus of a vehicle, according to an exemplary embodiment of the present disclosure;

DETAILED DESCRIPTION

Figure 1:
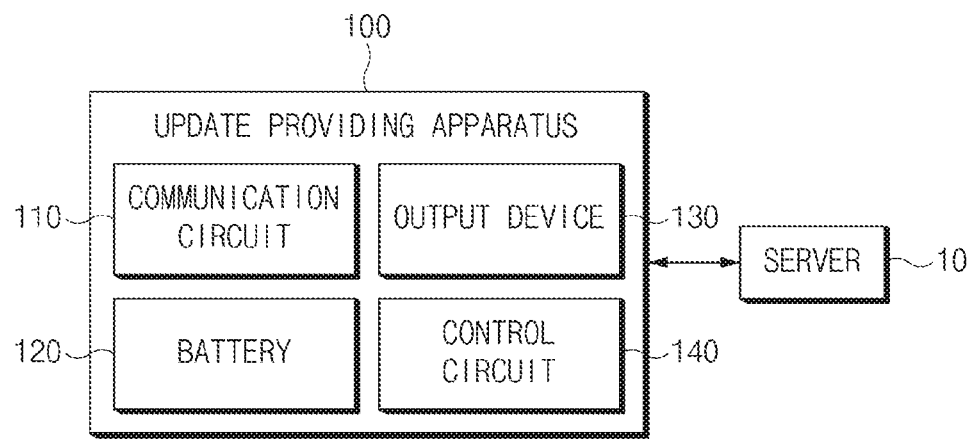
FIG. 1 is a block diagram illustrating a configuration of an update providing apparatus of a vehicle, according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referral to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present disclosure may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, exemplary embodiments of the present disclosure will be described in detail with reference to the accompanying drawings. In the drawings, the same reference numerals will be used throughout to designate the same or equivalent elements. In addition, a detailed description of well-known features or functions will be ruled out in order not to unnecessarily obscure the gist of the present disclosure.

In describing elements of exemplary embodiments of the present disclosure, the terms first, second, A, B, (a), (b), and the like may be used herein. These terms are only used to distinguish one element from another element, but do not limit the corresponding elements irrespective of the order or priority of the corresponding elements. Furthermore, unless otherwise defined, all terms including technical and scientific terms used herein are to be interpreted as is customary in the art to which this invention belongs. It will be understood that terms used herein should be interpreted as having a meaning that is consistent with their meaning in the context of the present disclosure and the relevant art and will not be interpreted in an idealized or overly formal sense unless expressly so defined herein.

FIG. 1 is a block diagram illustrating a configuration of an update providing apparatus of a vehicle, according to an exemplary embodiment of the present disclosure. Referring to FIG. 1, an update providing apparatus 100 of a vehicle according to an exemplary embodiment may include a communication circuit 110, a battery 120, an output device 130, and a control circuit 140. The update providing apparatus 100 of FIG. 1 may be mounted within the vehicle.

The communication circuit 110 may be configured to communicate with a server 10 wirelessly. In particular, the communication circuit 110 may support wireless communication of various schemes and may be configured to receive data from the server 10. The battery 120 may be configured to supply power to various elements mounted within the vehicle. For example, the battery 120 may be configured to supply power to the communication circuit 110, the output device 130, and the control circuit 140. The power of the battery 120 may be charged while the vehicle is being driven and may be consumed when performing the update. The output device 130 may be configured to output various notifications to a driver. The output device 130 may include, for example, a speaker and/or a display.

The control circuit 140 (e.g., a controller) may be electrically connected to the communication circuit 110, the battery 120, and the output device 130. The control circuit 140 may be configured to operate the communication circuit 110, the battery 120, and the output device 130 and perform various data processing and calculation. The control circuit 140 may be, for example, an electronic control unit (ECU), a micro controller unit (MCU), or another sub-controller, which is mounted within the vehicle.

According to an exemplary embodiment, the control circuit 140 may be configured to obtain update data associated with a target controller mounted within the vehicle, from the server 10. The control circuit 140 may be configured to download the update data associated with the target controller from the server 10, when there is a need to update the target controller, for example, when a latest version software of the target controller is present in the server 10. Additionally, the control circuit 140 may be configured to calculate the estimated remaining amount of the battery 120 (e.g., estimating remaining charge of the battery) upon completing the update, when the update is approved by the driver of the vehicle. Hereinafter, an operation of calculating the estimated remaining amount will be described in detail.

According to an exemplary embodiment, the control circuit 140 may be configured to calculate the estimated remaining amount upon completing the update based on the estimated required time of the update, the estimated required time of a roll-back, and the current remaining amount of the battery 120. In particular, the control circuit 140 may be configured to calculate the remaining time including the estimated required time of the update and the estimated required time of the roll-back, based on the size of update data. The control circuit 140 may then be configured to calculate the estimated remaining amount based on the remaining time and the current remaining amount. For example, the control circuit 140 may be configured to calculate the estimated state of charge (SOC) upon completing the update based on the remaining time and the current SOC of the battery 120. The control circuit 140 may also be configured to calculate an estimated state of function (SOF) upon completing the update based on the estimated SOC and temperature information. For example, the estimated SOC may be calculated based on the current SOC, the discharge current of the battery 120, the remaining time, and the capacity of the battery 120. For example, the estimated SOF may be calculated based on the current SOC and the minimum temperature of the battery 120 during a particular time period. Notably, the state of function refers to a battery readiness related to usable energy based on the state of charge in relation to available capacity.

Further, the control circuit 140 may be configured to perform the update on the target controller, when the estimated remaining amount satisfies a particular condition. For example, the control circuit 140 may be configured to perform the update on the target controller, when the estimated SOF satisfies a particular condition. The control circuit 140 may be configured to perform the update, when the estimated remaining amount is greater than a particular value. For example, the specified value may be the voltage of the battery 120 required to start the engine of the vehicle.

The control circuit 140 may then be configured to output a message for notifying a driver that the update is impossible, using the output device 130, when the estimated remaining amount does not satisfy the particular condition. After the update is started, the control circuit 140 may be configured to monitor the estimated remaining amount while performing the update. In preparation for when the power of the battery 120 is consumed due to the manipulation of the driver or the like, the control circuit 140 may be configured to continuously monitor the estimated remaining amount while performing the update.

Additionally, the control circuit 140 may be configured to output a warning message using the output device 130, when the estimated remaining amount is less than the particular value while the control circuit 140 performs the update. In particular, the control circuit 140 may be configured to output the warning message to induce the driver to stop the manipulation. The control circuit 140 may also be configured to interrupt the update instead of outputting the warning message and then perform a roll-back. Particularly, the control circuit 140 may be configured to interrupt the update and perform the roll-back when the current remaining amount of the battery 120 is less than a particular value while performing the update. Since it may be difficult for the control circuit 140 to perform the update any longer, the control circuit 140 may be configured to immediately interrupt the update and then perform the roll-back.

Figure 2:
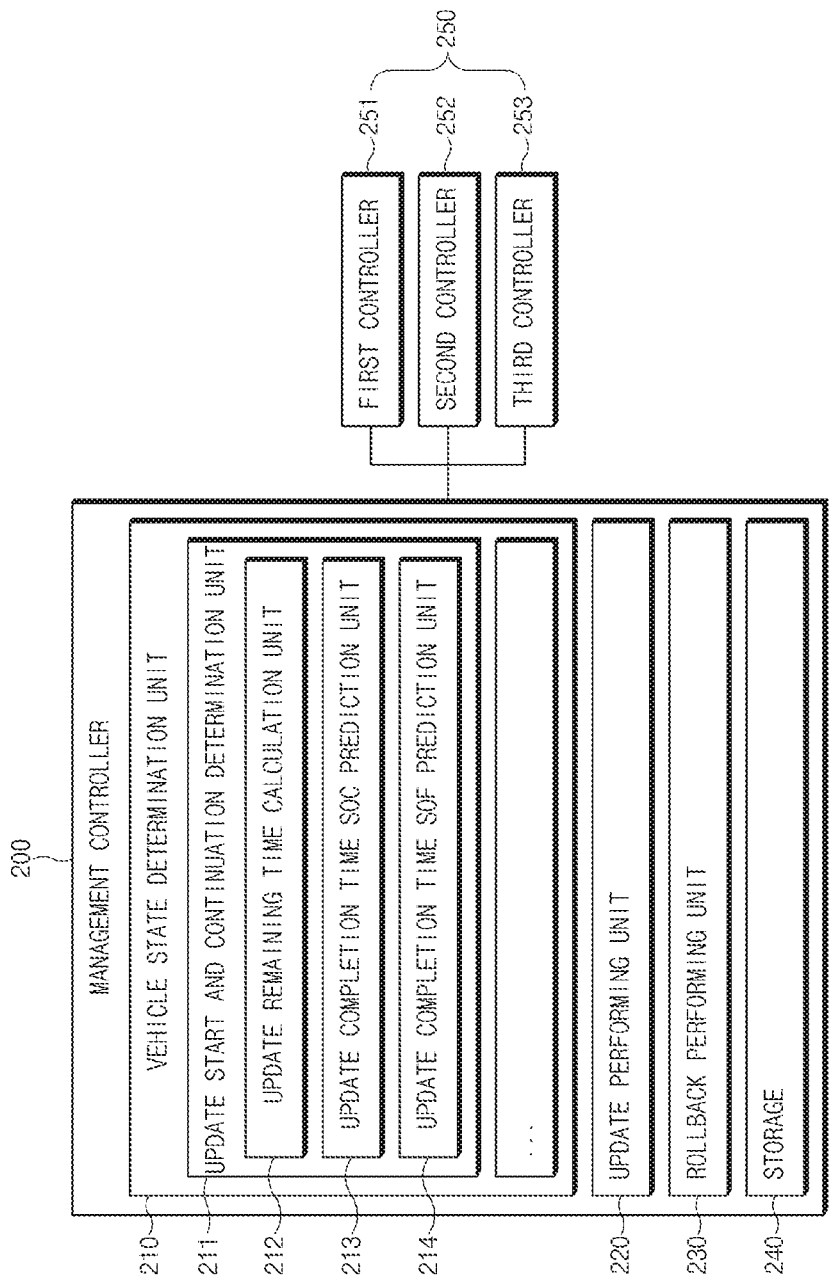
FIG. 2 is a block diagram illustrating a configuration of an update providing apparatus of a vehicle, according to an exemplary embodiment of the present disclosure.

FIG. 2 is a block diagram illustrating a configuration of an update providing apparatus of a vehicle, according to an exemplary embodiment of the present disclosure. Referring to FIG. 2, an update providing apparatus of a vehicle according to an exemplary embodiment may include a management controller 200 and a plurality of target controllers 250. The management controller 200 may include a vehicle state determination unit 210, an update performing unit 220, a roll-back performing unit 230, and storage 240.

In particular, the management controller 200 may be configured to manage the update of each of a first controller 251, a second controller 252, and a third controller 253. The management controller 200 may be configured to download ROM data of a controller to be updated, from a server. The storage 240 may be configured to store the downloaded ROM data. The update performing unit 220 may be configured to transmit an update execution command to the target controller 250 and transmit the ROM data to the target controller 250. The vehicle state determination unit 210 may be configured to determine the state of the vehicle for performing the update. The roll-back performing unit 230 may be configured to restore the controller, when the update fails.

Further, the vehicle state determination unit 210 may include an update start and continuation determination unit 211, and the update start and continuation determination unit 211 may include an update remaining time calculation unit 212, an update completion time SOC prediction unit 213, and an update completion time SOF prediction unit 214. The update start and continuation determination unit 211 may be configured to calculate the remaining time, the completion time estimated SOC, the completion time estimated SOF, and the like and may be configured to determine whether the update is started and continued, based on the calculated value.

The update remaining time calculation unit 212 may be configured to calculate the estimated required time of the update. The estimated required time of the update may include a time for the roll-back based on the failure of the update. For example, the estimated required time of the update may be calculated using the following equations.

$$\text{Estimated required time of the update} = \text{Update remaining time} + \text{Roll-back required time} = \text{Remaining amount of Data/rate} + \text{Total amount of Data/rate} \quad \text{Equation 1}$$

wherein, the rate may be data throughput per second.

The update completion time SOC prediction unit 213 may be configured to calculate the estimated SOC upon completing the update. The estimated SOC may be calculated based on the estimated required time of the update. For example, the estimated SOC may be calculated by the following equation.

$$\text{Estimated SOC} = \text{Current SOC} - \text{Battery current} * \text{Estimated required time of update} * 100 / C\_\text{norm} \quad \text{Equation 2}$$

wherein, C_norm may be a battery capacity [AH].

The update completion time SOF prediction unit 214 may be configured to calculate the estimated SOF upon completing the update. The estimated SOF may be calculated based on the estimated SOC. For example, the estimated SOF may be calculated by the following equation.

$$\text{Estimated SOF} = f(\text{Estimated SOC}, \text{Minimum battery temperature during a specified time period}) \quad \text{Equation 3}$$

For example, the current SOF may be calculated by the following equation.

$$\text{Current SOF} = f(\text{Current SOC}, \text{Current battery temperature}) \quad \text{Equation 4}$$

The update start and continuation determination unit 211 may be configured to compare a battery voltage value V_crank_enable required to start an engine with the estimated SOF and/or the current SOF, and thus may be configured to determine whether the update is started and continued. The target controller 250 may be updated based on the update execution command and the ROM data, which are received from the management controller 200.

FIG. 3 is a view for describing an exemplary operation of an update providing apparatus of a vehicle, according to an exemplary embodiment of the present disclosure. Referring to FIG. 3, an update providing apparatus according to an exemplary embodiment may download ROM data for updating a target controller. The update providing apparatus may be configured to provide a driver with a message saying, for example, that "Do you want to perform an update?" in an update ready state. In other words, the message may be related to triggering a request of whether to perform an update. The update providing apparatus may be configured to predict whether it is possible to maintain the starting performance, upon completing the update, when the driver approves the update.

The update providing apparatus may be configured to initiate the update, when it is predicted that it is possible to maintain the starting performance (SOF_est>V_crank_enable) upon completing the update. While performing the update, the update providing apparatus may be configured to continuously predict whether it is possible to maintain the starting performance, upon completing the update. The update providing apparatus may also be configured to display the progress of the update. During the update, the estimated SOF SOF_est may be reduced due to the driver's power usage. The update providing apparatus may accordingly be configured to provide the driver with a message saying, for example, "please reduce load usage." and may continue the update, when it is predicted that the starting performance is insufficient (SOF_est<V_crank_enable), upon completing the update.

The SOF may be further reduced due to the driver's power usage continued while the update is performed. The update providing apparatus may be configured to interrupt the update and perform a roll-back, when a current battery state is determined as the starting performance is insufficient (SOF<V_crank_enable). In particular, the update providing apparatus may be configured to interrupt the update and then may provide a user with a message saying, for example, "the update is interrupted due to a low battery level".

Figure 4:
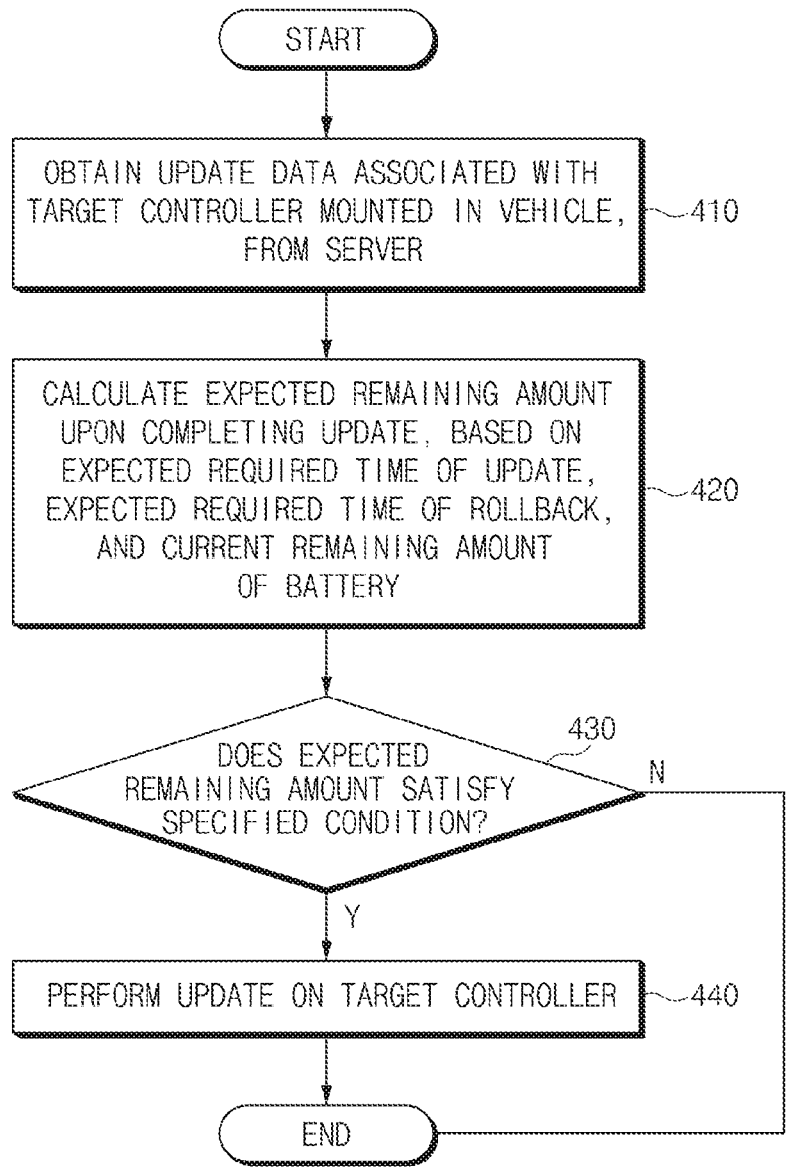
FIG. 4 is a flowchart for describing an update providing method of a vehicle, according to various exemplary embodiments of the present disclosure.

FIG. 4 is a flowchart for describing an update providing method of a vehicle, according to various exemplary embodiments of the present disclosure. Hereinafter, it may be assumed that the update providing apparatus 100 of FIG. 1 performs the process of FIG. 4. In addition, in a description of FIG. 4, it may be understood that an operation described as being performed by an apparatus may be executed by the control circuit 140 or a sub-controller of the update providing apparatus 100.

Referring to FIG. 4, in operation 410, the update providing apparatus may be configured to obtain update data associated with a target controller mounted within a vehicle, from a server. For example, the update providing apparatus may be configured to download ROM data of a latest version for updating the target controller, from the server. In operation 420, the update providing apparatus may be configured to calculate the estimated remaining amount upon completing the update, based on the estimated required time of the update, the estimated required time of a roll-back, and the current remaining amount of the battery. For example, the update providing apparatus may be configured to calculate an estimated SOC, an estimated SOF, and the like based on the above-described pieces of information.

In operation 430, the update providing apparatus may be configured to determine whether the estimated remaining amount satisfies a particular condition. For example, the update providing apparatus may be configured to determine whether the estimated SOF is greater than a battery voltage for engine ignition. In operation 440, the update providing apparatus may be configured to perform the update on the target controller, when the estimated remaining amount satisfies the particular condition. The update providing apparatus may also be configured to continuously monitor the estimated remaining amount even while performing the update and determine whether to continue the update. When the estimated remaining amount does not satisfy the particular condition the update providing apparatus may be configured to stop the update.

Figure 5:
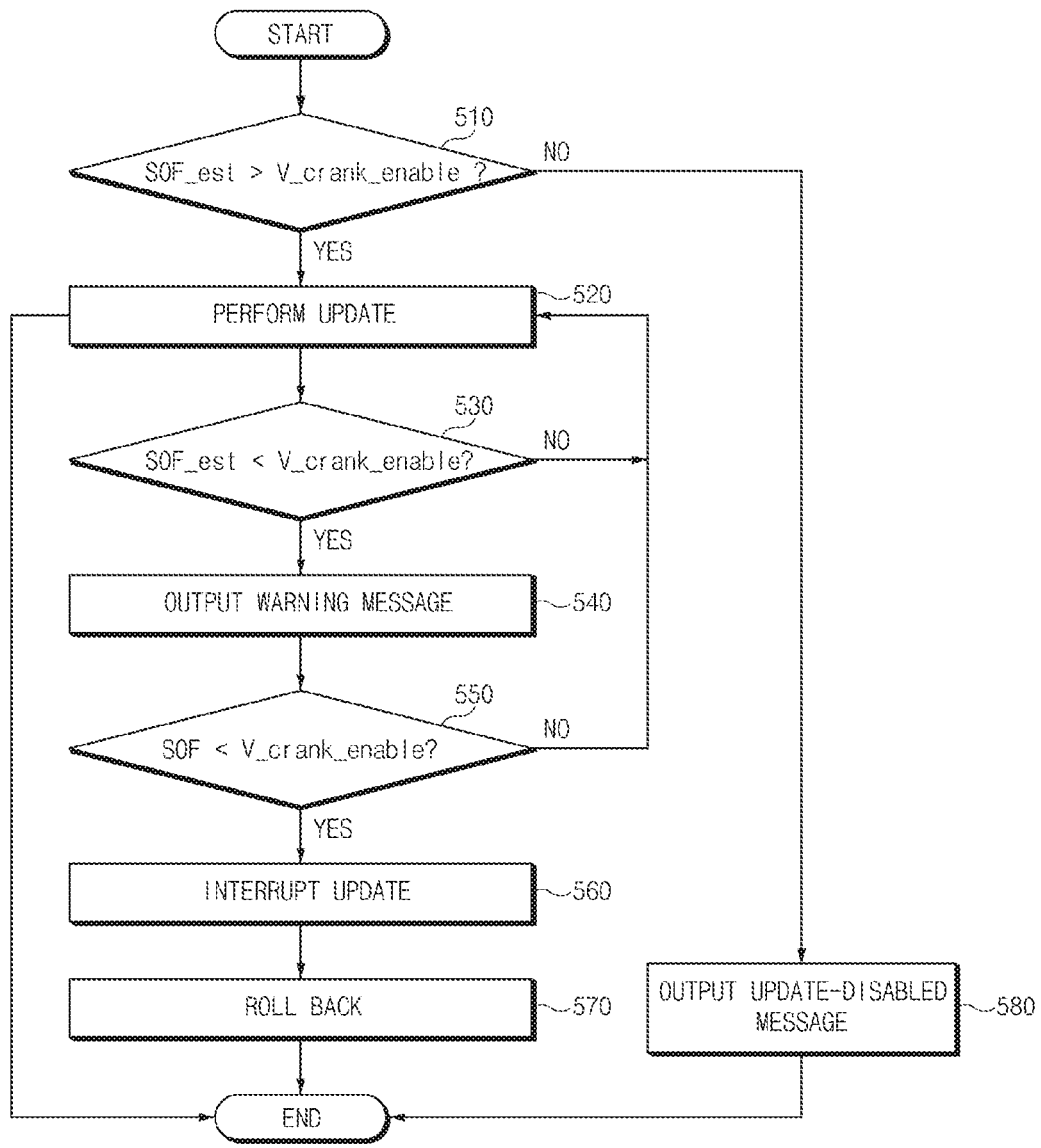
FIG. 5 is a flowchart for describing an update providing method of a vehicle, according to various exemplary embodiments of the present disclosure.

FIG. 5 is a flowchart for describing an update providing method of a vehicle, according to various exemplary embodiments of the present disclosure. Hereinafter, it may be assumed that the update providing apparatus 100 of FIG. 1 performs the process of FIG. 5. In addition, in a description of FIG. 5, it may be understood that an operation described as being performed by an apparatus may be executed by the control circuit 140 or a sub-controller of the update providing apparatus 100.

Referring to FIG. 5, in operation 510, the update providing apparatus may be configured to determine whether an estimated SOF is greater than a particular value (SOF_est>V_crank_enable). The specified value may be the minimum voltage required to start an engine. In operation 580, the update providing apparatus may be configured to output an update-disabled message and terminate the process of FIG. 5, when the estimated SOF is less than the particular value.

In operation 520, the update providing apparatus may be configured to perform the update, when the estimated SOF is greater than the specified value. The update providing apparatus may be configured to terminate the process of FIG. 5, when the update is completed. In operation 530, the update providing apparatus may be configured to monitor whether the estimated SOF is less than the specified value (SOF_est<V_crank_enable), while performing the update. The update providing apparatus may be configured to continuously verify the estimated SOF and may be configured to continue the update, when the estimated SOF is greater than the particular value. In operation 540, the update providing apparatus may be configured to output a warning message, when the estimated SOF is less than the particular value. For example, the update providing apparatus may be configured to output a warning saying "please reduce the use of the electrical load". While outputting the warning message, the update providing apparatus may be configured to continue the update.

In operation 550, the update providing apparatus may be configured to monitor whether the current SOF is less than a particular value (SOF<V_crank_enable). The update providing apparatus may further be configured to continuously verify the current SOF while outputting the warning message, when the estimated SOF is less than the particular value and continue the update and the output of the warning message, when the SOF is greater than the particular value. In operation 560, the update providing apparatus may be configured to interrupt the update, when the current SOF is less than the particular value; in operation 570, the update providing apparatus may be configured to roll back the target controller (e.g., reverse the update due to insufficient battery power).

Figure 6:
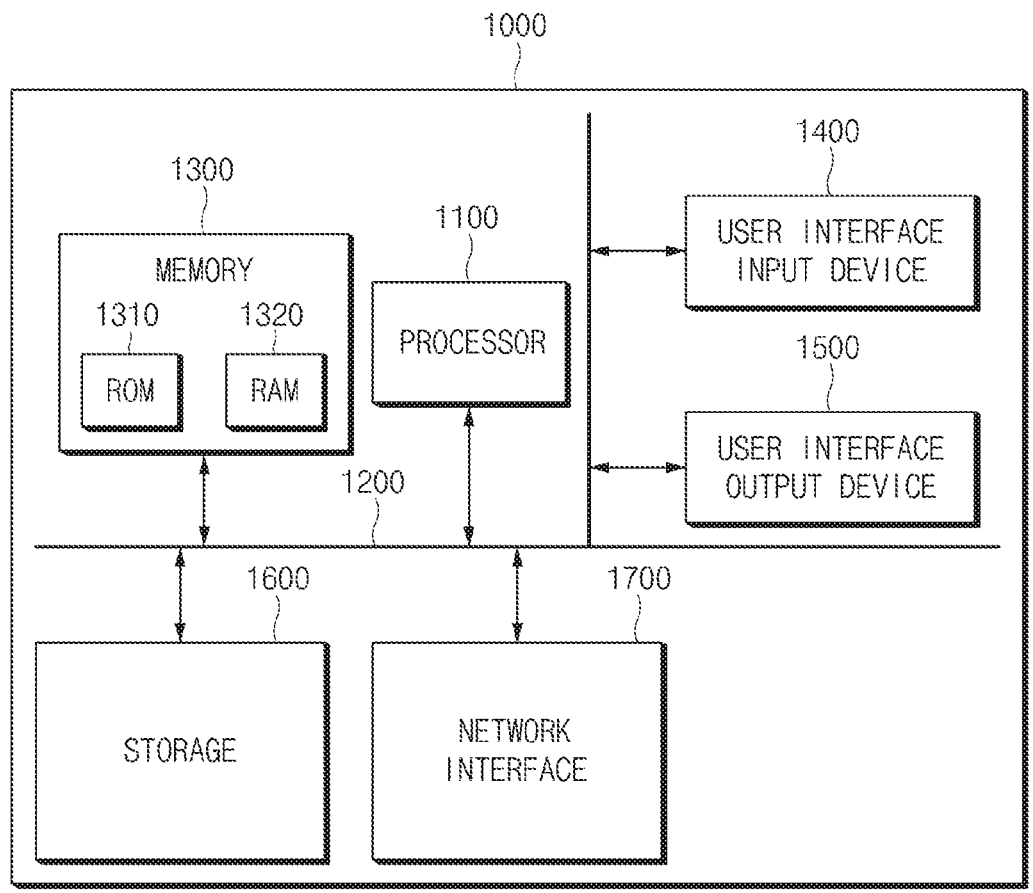
FIG. 6 illustrates a computing system according to an exemplary embodiment of the present disclosure.

FIG. 6 illustrates a computing system according to an exemplary embodiment of the present disclosure. Referring to FIG. 6, an apparatus according to an exemplary embodiment of the present disclosure may be implemented through a computing system. A computing system 1000 may include at least one processor 1100, a memory 1300, a user interface input device 1400, a user interface output device 1500, storage 1600, and a network interface 1700, which are connected with each other via a system bus 1200. The processor 1100 may be a central processing unit (CPU) or a semiconductor device that processes instructions stored in the memory 1300 and/or the storage 1600. Each of the memory 1300 and the storage 1600 may include various types of volatile or nonvolatile storage media. For example, the memory 1300 may include a read only memory (ROM) and a random access memory (RAM).

Accordingly, the operations of the method or algorithm described in connection with the exemplary embodiments disclosed in the specification may be directly implemented with a hardware module, a software module, or a combination of the hardware module and the software module, which is executed by the processor 1100. The software module may reside on a storage medium (i.e., the memory 1300 and/or the storage 1600) such as a random access memory (RAM), a flash memory, a read only memory (ROM), an erasable and programmable ROM (EPROM), an electrically EPROM (EEPROM), a register, a hard disk drive, a removable disc, or a compact disc-ROM (CD-ROM). The exemplary storage medium may be coupled to the processor 1100. The processor 1100 may read out information from the storage medium and may write information in the storage medium. Alternatively, the storage medium may be integrated with the processor 1100. The processor and storage medium may be implemented with an application specific integrated circuit (ASIC). The ASIC may reside in a user terminal. Alternatively, the processor and storage medium may reside as a separate component in the user terminal.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims. Therefore, exemplary embodiments of the present disclosure are not intended to limit the technical spirit of the present disclosure, but provided only for the illustrative purpose. The scope of protection of the present disclosure should be construed by the attached claims, and all equivalents thereof should be construed as being included within the scope of the present disclosure.

According to an exemplary embodiment of the present disclosure, an apparatus and a method for providing an update of a vehicle may determine whether to perform the update, based on the estimated remaining amount calculated based on various pieces of data, and thus may secure the starting performance of the vehicle performing a wireless update. Besides, a variety of effects directly or indirectly understood through the present disclosure may be provided.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An update providing apparatus of a vehicle, comprising:
   a communication circuit configured to communicate with a server wirelessly;
   an output device;
   a battery; and
   a control circuit electrically connected to the communication circuit and the battery,
   wherein the control circuit is configured to:
   obtain update data associated with a target controller mounted within the vehicle, from the server;
   calculate an estimated remaining amount of a battery charge upon completing an update, based on an estimated required time for the update, an estimated required time for a roll-back, and a current remaining amount of the battery charge;
   in response to determining that the estimated remaining amount of the battery charge satisfies a particular condition, perform the update on the target controller;
   in response to determining that the estimated remaining amount of the battery charge is less than a particular value of the particular condition, operate the output device by the control circuit to output a warning message while performing the update; and
   in response to determining that the current remaining amount of the battery charge is less than the particular value, interrupt the update and perform the roll-back, while performing the update, after the outputting the warning message,
   wherein the control circuit is configured to:
   calculate an estimated state of charge (SOC) of the battery upon completing the update based on the remaining time and a current SOC of the battery;
   calculate an estimated state of function (SOF) of the battery upon completing the update based on the estimated SOC and temperature information; and
   perform the update on the target controller, when the estimated SOF satisfies a specified condition,
   wherein the estimated remaining amount of the battery charge includes the estimated SOF, and
   wherein the estimated SOF is calculated based on the current SOC and a minimum battery temperature during a particular time period.

2. The apparatus of claim 1, wherein the control circuit is configured to:

calculate a remaining time including the estimated required time for the update and the estimated required time of the roll-back, based on a size of the update data; and calculate the estimated remaining amount of the battery charge based on the remaining time required for the update and the current remaining amount.

3. The apparatus of claim 1, wherein the control circuit is configured to:

in response to determining that the update is approved by a driver of the vehicle, calculate the estimated remaining amount of the battery charge.

4. The apparatus of claim 1, wherein the output device is operated by the control circuit to, in response to determining that the estimated remaining amount of the battery charge does not satisfy the particular condition, output a message indicating that the update is impossible.

5. The apparatus of claim 1, wherein the control circuit is configured to:

monitor the estimated remaining amount of the battery charge, while performing the update.

6. The apparatus of claim 1, wherein the estimated SOC is calculated based on the current SOC, a battery discharge current, the remaining time required for the update, and a battery capacity.

7. The apparatus of claim 1, wherein the control circuit is configured to:

in response to determining that the estimated remaining amount of the battery charge is greater than the particular value, perform the update.

8. The apparatus of claim 7, wherein the particular value is a battery voltage required to start an engine of the vehicle.

9. An update providing method of a vehicle, comprising:

obtaining, by a processor, update data associated with a target controller mounted within the vehicle, from a server;

calculating, by the processor, an estimated remaining amount of a battery charge upon completing an update, based on an estimated required time for the update, an estimated required time for a roll-back, and a current remaining amount of the battery charge;

in response to determining that the estimated remaining amount of the battery charge satisfies a particular condition, performing, by the processor, the update on the target controller;

in response to determining that the estimated remaining amount of the battery charge is less than the particular value of the particular condition, outputting, by the processor, a warning message while performing the update; and in response to determining that the current remaining amount of the battery charge is less than the particular value, interrupting, by the processor, the update, and performing, by the processor, the roll-back, while performing the update, after the outputting the warning message, wherein the calculating the estimated remaining amount of a battery charge includes:

calculating, by the processor, an estimated state of function (SOF) of the battery upon completing the update based on an estimated state of charge (SOC) and temperature information; and wherein the performing of the update includes:

performing, by the processor, the update on the target controller, when the estimated SOF satisfies a particular condition, and wherein the estimated SOF is calculated based on a current SOC and a minimum battery temperature during a particular time period.

10. The method of claim 9, wherein the calculating of the estimated remaining amount includes:

calculating, by the processor, a remaining time including the estimated required time for the update and the estimated required time for the roll-back, based on a size of the update data; and calculating, by the processor, the estimated remaining amount of the battery charge based on the remaining time required for the update and the current remaining amount.

11. The method of claim 10, wherein the calculating of the estimated remaining amount of the battery charge based on the remaining time and the current remaining amount includes:

calculating, by the processor, the estimated SOC of the battery upon completing the update based on the remaining time and the current SOC of the battery.

12. A non-transitory computer readable medium containing program instructions executed by a processor, the non-transitory computer readable medium comprising:

program instructions that obtain update data associated with a target controller mounted within the vehicle, from a server;

program instructions that calculate an estimated remaining amount of a battery charge upon completing an update, based on an estimated required time for the update, an estimated required time for a roll-back, and a current remaining amount of the battery charge;

program instructions that, in response to determining that the estimated remaining amount of the battery charge satisfies a particular condition, perform the update on the target controller;

program instructions that, in response to determining that the estimated remaining amount of the battery charge is less than a particular value of the particular condition, output a warning message while performing the update; and program instructions that, in response to determining that the current remaining amount of the battery charge is less than the particular value, interrupt the update and perform the roll-back, while performing the update, after the outputting the warning message, wherein the program instructions that calculate an estimated remaining amount of a battery charge include:

program instructions that calculate an estimated state of function (SOF) of the battery upon completing the update based on an estimated state of charge (SOC) and temperature information, wherein the program instructions that perform the update include:

program instructions that perform the update on the target controller, when the estimated SOF satisfies a particular condition, wherein the estimated SOF is calculated based on a current SOC and a minimum battery temperature during a particular time period.

13. The non-transitory computer readable medium of claim 12, wherein the program instructions that calculate the estimated remaining amount include:

program instructions that calculate a remaining time including the estimated required time for the update and the estimated required time of the roll-back, based on a size of the update data; and program instructions that calculate the estimated remaining amount of the battery charge based on the remaining time required for the update and the current remaining amount.

14. The non-transitory computer readable medium of claim 13, wherein the program instructions that calculate the estimated remaining amount of the battery charge based on the remaining time and the current remaining amount include:
program instructions that calculate the estimated SOC of the battery upon completing the update based on the remaining time and the current SOC of the battery.

\* \* \* \* \*